US011210436B2

(12) United States Patent
Micks et al.

(10) Patent No.: US 11,210,436 B2
(45) Date of Patent: Dec. 28, 2021

(54) VIRTUAL SENSOR-DATA-GENERATION SYSTEM AND METHOD SUPPORTING DEVELOPMENT OF ALGORITHMS FACILITATING NAVIGATION OF RAILWAY CROSSINGS IN VARYING WEATHER CONDITIONS

(71) Applicant: Ford Global Technologies, LLC, Dearborn, MI (US)

(72) Inventors: Ashley Elizabeth Micks, Mountain View, CA (US); Scott Vincent Myers, Camarillo, CA (US); Harpreetsingh Banvait, Sunnyvale, CA (US); Sneha Kadetotad, Cupertino, CA (US)

(73) Assignee: Ford Global Technologies, LLC, Dearborn, MI (US)

( * ) Notice: Subject to any disclaimer, the term of this patent is extended or adjusted under 35 U.S.C. 154(b) by 1291 days.

(21) Appl. No.: 15/204,857

(22) Filed: Jul. 7, 2016

(65) Prior Publication Data
US 2018/0011954 A1    Jan. 11, 2018

(51) Int. Cl.
| | |
|---|---|
| G06F 7/48 | (2006.01) |
| G06F 30/20 | (2020.01) |
| G06K 9/00 | (2006.01) |
| G06F 30/15 | (2020.01) |
| G05D 1/02 | (2020.01) |
| G06N 20/00 | (2019.01) |
| B60W 50/00 | (2006.01) |

(52) U.S. Cl.
CPC .............. *G06F 30/20* (2020.01); *G05D 1/021* (2013.01); *G06F 30/15* (2020.01); *G06K 9/00798* (2013.01); *B60W 2050/0028* (2013.01); *G06N 20/00* (2019.01)

(58) Field of Classification Search
CPC ................................................... G06F 17/5009
USPC ............................................................ 703/8
See application file for complete search history.

(56) References Cited

U.S. PATENT DOCUMENTS

| | | | |
|---|---|---|---|
| 6,553,308 B1 | 4/2003 | Uhlmann | |
| 2006/0293819 A1* | 12/2006 | Harumoto | ....... B60W 30/18145 |
| | | | 701/41 |
| 2011/0190972 A1* | 8/2011 | Timmons | ............... G01C 21/34 |
| | | | 701/31.4 |

(Continued)

FOREIGN PATENT DOCUMENTS

| | | |
|---|---|---|
| CN | 102426425 A | 4/2012 |
| DE | 102009053509 A1 | 5/2011 |
| KR | 20000013675 A | 3/2000 |

*Primary Examiner* — Timothy A Mudrick
(74) *Attorney, Agent, or Firm* — David R. Stevens; Stevens Law Group

(57) ABSTRACT

A method for generating training data is disclosed. The method may include executing a simulation process. The simulation process may include traversing a virtual, forward-looking sensor over a virtual road surface defining at least one virtual railroad crossing. During the traversing, the virtual sensor may be moved with respect to the virtual road surface as dictated by a vehicle-motion model modeling motion of a vehicle driving on the virtual road surface while carrying the virtual sensor. Virtual sensor data characterizing the virtual road surface may be recorded. The virtual sensor data may correspond to what a real sensor would have output had it sensed the road surface in the real world.

20 Claims, 4 Drawing Sheets

(56) References Cited

U.S. PATENT DOCUMENTS

| | | | |
|---|---|---|---|
| 2012/0083960 A1* | 4/2012 | Zhu | G06T 7/223 |
| | | | 701/23 |
| 2012/0296539 A1* | 11/2012 | Cooprider | B60W 10/06 |
| | | | 701/70 |
| 2013/0158800 A1 | 6/2013 | Trageser | |
| 2014/0236463 A1 | 8/2014 | Zhang | |
| 2018/0004210 A1* | 1/2018 | Iagnemma | G05D 1/0212 |

* cited by examiner

VIRTUAL SENSOR-DATA-GENERATION SYSTEM AND METHOD SUPPORTING DEVELOPMENT OF ALGORITHMS FACILITATING NAVIGATION OF RAILWAY CROSSINGS IN VARYING WEATHER CONDITIONS

BACKGROUND

Field of the Invention

This invention relates to vehicular systems and more particularly to systems and methods for generating training data suitable for use in developing, training, and proving algorithms for safely negotiating railroad crossings or the like in varying weather conditions.

Background of the Invention

To provide, enable, or support functionality such as driver assistance, controlling vehicle dynamics, and/or autonomous driving, well proven algorithms for interpreting sensor data are vital. Accordingly, what is needed is a system and method for generating training data suitable for use in developing, training, and proving such algorithms.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
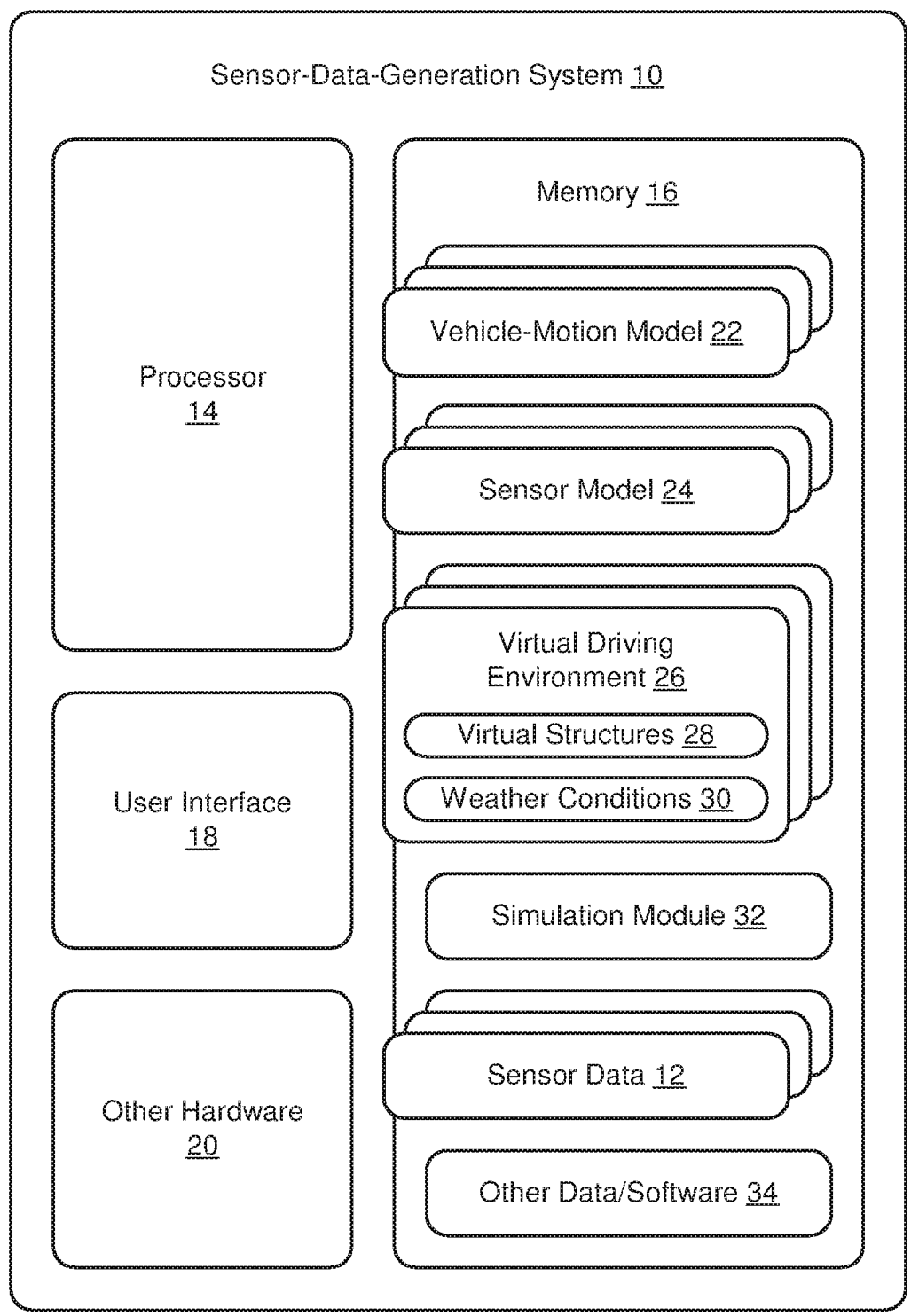
FIG. 1 is a schematic block diagram illustrating one embodiment of a sensor-data-generation system in accordance with the present invention.

Referring to FIG. 1, the real world presents an array of conditions and obstacles that are ever changing. This reality creates significant challenges for vehicle-based systems providing autonomous control of certain vehicle dynamics and/or autonomous driving. To overcome these challenges, a vehicle may be equipped with sensors and computer systems that collectively sense, interpret, and appropriately react to a surrounding environment. Key components of such computer systems may be one or more algorithms used to interpret data output by various sensors carried on-board such vehicles.

For example, certain algorithms may analyze one or more streams of sensor data characterizing an area (e.g., road surface) ahead of a vehicle, weather (e.g., temperature, presence or absence of precipitation, presence of water, ice, or snow on a road surface, or the like) in the ambient environment, vehicle dynamics (e.g., traction with respect to a road surface), or the like or any combination or sub-combination thereof. Other algorithms may be responsible for deciding what to do based on that data. All such algorithms must be well developed and thoroughly tested. In selected embodiments, an initial and significant portion of such development and testing may be accomplished in a virtual environment. Accordingly, a system 10 in accordance with the present invention may produce sensor data 12 suitable for developing, testing, and/or training various algorithms.

For example, in certain embodiments, a system 10 may execute a simulation in order to produce sensor data 12 suitable for developing, testing, and/or training various algorithms for recognizing and preparing for railroad crossings, cattle guards, or the like in varying weather conditions. To do this, a system 10 may be embodied as hardware, software, or some combination thereof.

In selected embodiments, a system 10 may include computer hardware and computer software. The computer hardware of a system 10 may include one or more processors 14, memory 16, a user interface 18, other hardware 20, or the like or a combination or sub-combination thereof. The memory 16 may be operably connected to the one or more processors 14 and store the computer software. This may enable the one or more processors 14 to execute the computer software.

A user interface 18 of a system 10 may enable an engineer, technician, or the like to interact with, run, customize, or control various aspects of a system 10. In selected embodiments, a user interface 18 of a system 10 may include one or more keypads, keyboards, touch screens, pointing devices, or the like or a combination or sub-combination thereof.

In selected embodiments, the memory 16 of a computer system 12 may store one or more vehicle-motion models 22, one or more sensor models 24, one or more virtual driving environments 26 (e.g., a virtual environment created using three dimensional modeling and animations tools and containing one or more virtual structures 28 such as railroad crossings, cattle guards, or the like as well as various virtual weather conditions 30), a simulation module 32, sensor data 12, other data or software 34, or the like or combinations or sub-combinations thereof.

A vehicle-motion model 22 may be a software model that may define for certain situations the motion of the body of a corresponding vehicle. In certain embodiments, such a vehicle motion model 22 may be quite basic. For example, it may simply define a path to take in traversing one or more virtual sensors (e.g., sensors defined by one or more sensor models 24) through a virtual driving environment 26. In other embodiments, a vehicle-motion model 22 may be more robust (e.g., have a higher fidelity to reality). For example, a vehicle-motion model 22 may be provided with one or more driver inputs (e.g., one or more values characterizing things such as velocity, drive torque, brake actuation, steering input, or the like or combinations or sub-combinations thereof) and information (e.g., data from a virtual driving environment 26) characterizing a road surface. With these inputs and information, a vehicle-motion model 22 may predict motion states of the body of a corresponding vehicle.

The parameters of a vehicle-motion model 22 may be determined or specified in any suitable manner. In selected embodiments, certain parameters of a vehicle-motion model 22 may be derived from previous knowledge of the mechanical properties (e.g., geometries, inertia, stiffness, damping coefficients, etc.) of a corresponding real-world vehicle.

As appreciated, the parameters may be different for different vehicles. Accordingly, in selected embodiments, a vehicle-motion model 22 may be vehicle specific. That is, one vehicle-motion model 22 may be suited to model the body dynamics of a first vehicle (e.g., a particular sports car), while another vehicle-motion model 22 may be suited to model the body dynamics of a second vehicle (e.g., a particular pickup truck).

A sensor model 24 may be a software model that may define or predict for certain situations or "views" the output of a corresponding real-world sensor. In certain embodiments, a sensor model 24 may be provided with information (e.g., data from a virtual driving environment 26) characterizing various views or conditions of a road surface, ambient weather conditions, or the like. With this information, a sensor model 24 may produce what an actual sensor would output if presented with those views or conditions in the real world.

In selected embodiments, real world sensors of interest may comprise transducers that sense or detect some characteristic of an environment and provide a corresponding output (e.g., an electrical or optical signal) that defines that characteristic. For example, one or more real world sensors of interest may be accelerometers that output an electrical signal characteristic of the proper acceleration being experienced thereby. Such accelerometers may be used to determine the orientation, acceleration, velocity, and/or distance traveled by a vehicle. Other real world sensors of interest may include cameras, laser scanners, lidar scanners, ultrasonic transducers, radar devices, gyroscopes, inertial measurement units, revolution counters or sensors, strain gauges, temperature sensors, or the like.

A sensor model 24 may model the output produced by any real world sensor of interest. As appreciated, the outputs may be different for different real world sensors. Accordingly, in selected embodiments, a sensor model 24 may be sensor specific. That is, one sensor model 24 may be suited to model the output of a first sensor (e.g., a particular camera), while another sensor model 24 may be suited to model the output of a second sensor (e.g., a particular laser scanner).

A sensor model 24 may produce an output of any suitable format. For example, in selected embodiments, a sensor model 24 may output a signal (e.g., analog signal) that a corresponding real-world sensor would produce. Alternatively, a sensor model 24 may output a processed signal. For example, a sensor model 24 may output a processed signal such as that output by a data acquisition system. Accordingly, in selected embodiments, the output of a sensor model 24 may be a conditioned, digital version of the signal that a corresponding real-world sensor would produce.

A simulation module 32 may be programmed to use a virtual driving environment 26, a vehicle-motion model 22, and one or more sensor models 24 to produce an output (e.g., sensor data 12) modeling what would be output by one or more corresponding real world sensors had the one or more real world sensors been mounted to a vehicle (e.g., the vehicle modeled by the vehicle-motion model 22) driven on an actual driving environment like (e.g., substantially or exactly matching) the virtual driving environment 26.

Figure 2:
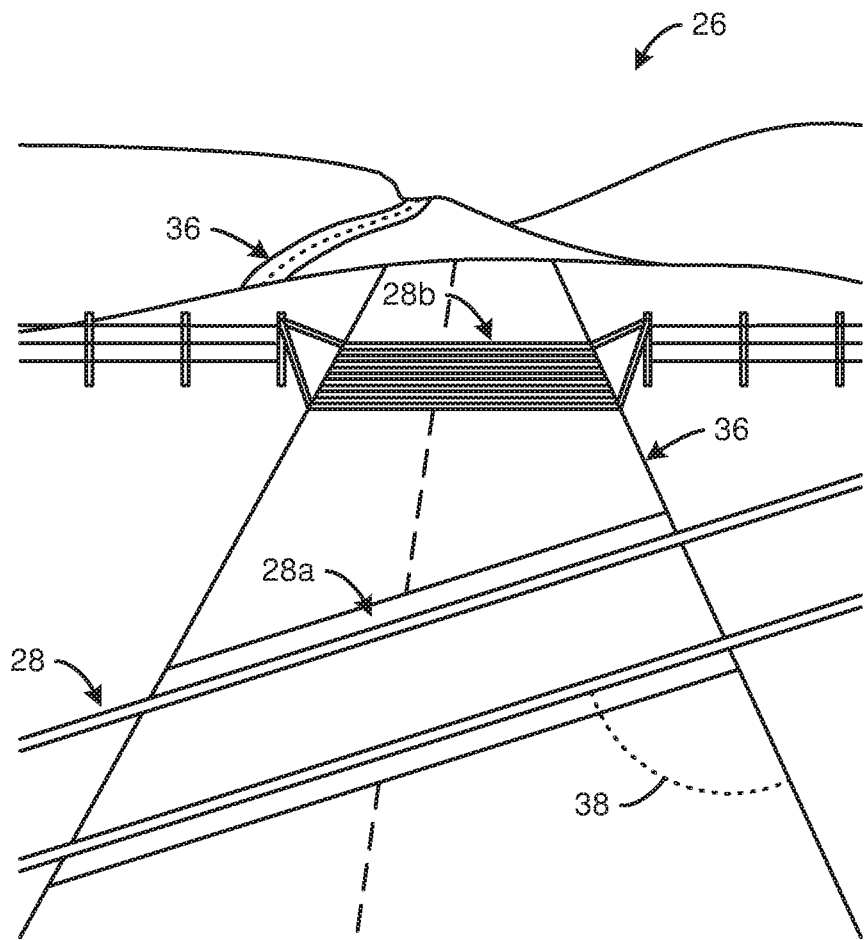
FIG. 2 is a schematic diagram illustrating one embodiment of a virtual driving environment including railroad crossings and other structures in accordance with the present invention.

Referring to FIG. 2, in selected embodiments, a virtual driving environment 26 may comprise a virtual driving surface 36 (e.g., road 36) and one or more virtual structures 28 (e.g., one or more virtual railroad crossings 28a, virtual cattle guards 28b, or the like) positioned at various locations, orientations, or the like with respect to the driving surface 36. The virtual structures 28 in a virtual driving environment 26 may be features or objects that intermittently or irregularly affect the operation of a vehicle in the real world. Certain such structures 28 such a railroad tracks 28a and cattle guards 28b may create unique challenges, depending on various factors such as vehicular speed, curvature of the road 36, orientation (e.g., angle 38) of the structures 28 with respect to the road 36, temperature, precipitation, ice or snow on the road 36, or the like or a combination or sub-combination thereof.

In the real world, railroad tracks are found in various geographical regions and intersect roads at many locations. Real world railroad tracks are made of metal, while the roads they cross are typically not made of metal. This difference in material introduces sudden change in frictional coefficients when a vehicle drives from a road surface over a railroad track and back to the road surface. Under rain, snow, or other weather conditions, such a crossing may cause a real world vehicle to become unstable and deviate from its desired trajectory. These undesirable effects may be magnified when a railroad track crosses a road at an angle other than ninety degrees, crosses a road at a bend or curve in that road, or a combination thereof.

Real world cattle guards may cause similar problems. In grazing or range areas, a cattle guard may be used in the place of a gate. A vehicle may drive over a cattle guard, but cattle will not typically walk over one. Accordingly, the cattle guard may function as a gate (i.e., block the passage of cattle), without requiring any opening or closing in order to permit a vehicle to pass.

Real world cattle guards may be constructed of metal or paint. A metal cattle guard may include multiple rails that extend parallel to one another and, typically, orthogonal to the surrounding road. The rails may be spaced apart a distance that is significant with respect to (e.g., about equal in width to) the hooves of cattle, but insignificant (e.g., at least passable) to the wheels of a vehicle. The rails may be narrow enough that cattle cannot confidently step thereon to cross the cattle guard. Moreover, below the spaced rails may be open space. Accordingly, cattle may recognize the uncertain footing provided by a metal cattle guard and not make an attempt to cross it.

The metal rails of a cattle guard are dissimilar from the surface of the surrounding road. This difference in material may introduce abrupt changes in frictional coefficients as a real world vehicle drives over a metal cattle guard and back to a road surface. Under rain, snow, or other weather conditions these abrupt changes may cause a vehicle to become unstable and deviate from its desired trajectory. These undesirable effects may be magnified by certain oscillations the rails of a cattle guard induce in the suspension of the vehicle.

In the real world, a painted cattle guard may remind cattle of one or more metal cattle guards they have previously encountered and, therefore, produce the same barrier or blocking effect. However, a painted cattle guard may not provide the same uncertain footing that is provided by a metal cattle guard. For example, a painted cattle guard may include multiple lines that are painted or adhered onto a road to extend parallel to one another and, typically, orthogonal to the surrounding road. The lines may be spaced apart a distance that resembles that of a metal cattle guard. Accordingly, cattle conditioned to metal cattle guards may not see sufficient difference in a painted cattle guard to ever test it.

A painted cattle guard may have certain advantages over a metal cattle guard. A painted cattle guard may be much less expensive to install. Additionally, a painted cattle guard may be much less disruptive to the vehicles passing thereover. Specifically, a painted cattle guard may not cause the traction issues and suspension oscillations corresponding to a metal cattle guard.

In selected embodiments, a virtual driving environment 26 may include numerous virtual structures 28 such as virtual railroad crossings 28a, virtual cattle guards 28b of different types, or combinations thereof in a wide variety of locations and orientations (e.g., angles 38). In addition thereto, a virtual driving environment 26 may provide, support, or simulate numerous weather conditions 30 based on temperature and/or type, presence, absence, or degree of precipitation, road spray, traction inhibitors (e.g., water, ice, or snow) on a road surface, celestial lighting (e.g., lighting from sun or moon), terrestrial lighting (e.g., man-made lighting), or the like or any combination or sub-combination thereof. The number of permutations between numerous virtual structures 28 and numerous weather conditions 30 may be significant. Accordingly, a system 10 in accordance with the present invention may produce virtual sensor data 12 in large quantities in a short amount of time. Moreover, relevant parameters such as weather conditions, time of day, relative position of the virtual structures 28 (e.g., railroad crossings 28b, cattle guards 28b, or the like) to a virtual vehicle, the position and type of signs around such virtual structures 28, the appearance of the virtual structures 28, and the like may be randomized in the recorded sensor data 12 to ensure a diverse dataset with minimal bias.

Such a diverse dataset may be used to develop and/or train one or more algorithms that properly and repeatably interpret a real world driving environment. When implemented in the real world, those algorithms may lower the adverse effects associated with crossing railroad tracks 28a, cattle guards 28b, and the like in various weather conditions and in driver or driverless applications. For example, forward looking sensors may monitor a road surface ahead of a vehicle. Accordingly, algorithms developed and/or trained using virtual data 12 generated using systems and/or methods in accordance with the present invention may be used to perceive railroad tracks and/or cattle guards, distinguish between metal cattle guards and painted cattle guards, factor in weather conditions, implement appropriate responses or preparations, or the like or combinations or sub-combinations thereof.

Figure 3:
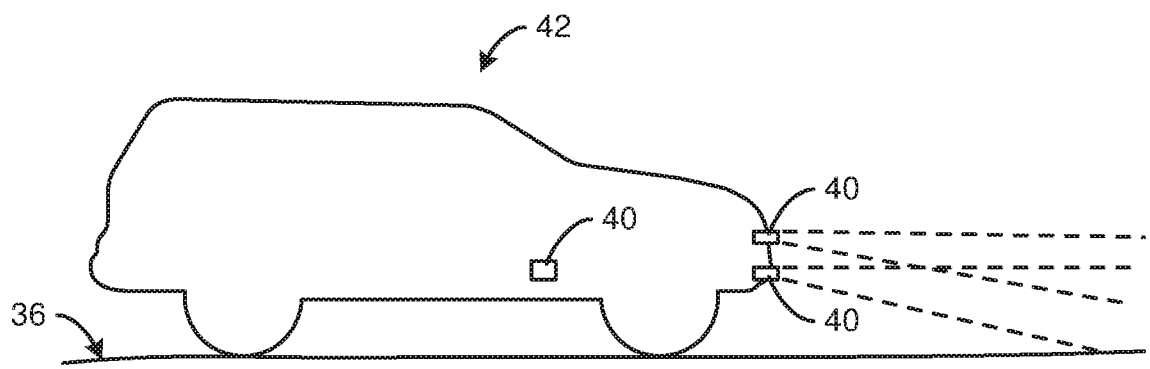
FIG. 3 is a schematic diagram illustrating a virtual vehicle at a first instant in time in which one or more virtual sensors are "viewing" a road surface and/or other conditions of a virtual driving environment.

Referring to FIG. 3, through a series of calculations, a simulation module 32 may effectively traverse one or more virtual sensors 40 (e.g., one or more virtual cameras, laser, ultrasonic, radar, or lidar devices, one or more virtual vehicle-dynamics sensors (e.g., one or more virtual traction control or drive train sensors), one or more virtual temperature sensors, or the like or a combination or sub-combination thereof) through a virtual driving environment 26 defining or including one or more weather conditions and a plurality of virtual railroad crossings 28a, cattle guards 28b, or combinations thereof. In selected embodiments, this may include manipulating during such a traverse a point of view of certain virtual sensors 40 with respect to the virtual driving environment 26. More specifically, it may include moving during such a traverse one or more virtual sensors 40 with respect to the virtual driving environment 26 as dictated by a vehicle-motion model 22 modeling motion of a corresponding virtual vehicle 42 driving in the virtual driving environment 26 and carrying the one or more virtual sensors 40.

In selected embodiments, to properly account for the motion of the one or more virtual sensors 40, a simulation module 32 may take into consideration three coordinate systems. The first may be a global, inertial coordinate system within a virtual driving environment 26. The second may be an undisturbed coordinate system of a virtual vehicle 42 defined by or corresponding to a vehicle-motion model 22. This may be the coordinate system of an "undisturbed" version of the virtual vehicle 42, which may be defined as having its "xy" plane parallel to a ground plane (e.g., an estimated, virtual ground plane). The third may be a disturbed coordinate system of the vehicle 42. This may be the coordinate system of the virtual vehicle 42 performing roll, pitch, heave, and yaw motions which can be driver-induced (e.g., caused by virtualized steering, braking, accelerating, or the like) or road-induced (e.g., caused by a virtual driving environment 26 or certain virtual structures 28 or anomalies therewithin) or due to other virtual disturbances (e.g., weather conditions 30 such as side wind, wheel slippage due to loss of traction, or the like). A simulation module 32 may use two or more of these various coordinate systems to determine which views or conditions pertain to which virtual sensors 40 during a simulation process.

That is, in the real world, the sensors modeled by one or more sensor models 24 may be carried on-board a corresponding vehicle. Certain such sensors may be secured to move with the body of a corresponding vehicle. Accordingly, the view surveyed or condition sensed by sensors such as cameras, laser scanners, ultrasonic devices, radars, lidar devices, thermometers, vehicle-dynamics sensors, or the like may be change depending on the orientation of the corresponding vehicle with respect to the surrounding environment.

To simulate such effects in a system 10 in accordance with the present invention, a simulation module 32 may take into consideration the location and orientation of one or more virtual sensors 40 (e.g., sensors being modeled by one or more corresponding sensor models 24) within a coordinate system corresponding to the virtual vehicle 42 (e.g., the vehicle being modeled by the vehicle-motion model 22). A simulation module 32 may also take into consideration how such a vehicle-based coordinate system is disturbed in the form of roll, pitch, heave, and yaw motions predicted by a vehicle-motion model 22 based on virtualized driver inputs, road inputs defined by a virtual driving environment 26, and the like. Accordingly, for any simulated moment in time that is of interest, a simulation module 32 may calculate a location and orientation of a particular virtual sensor 40 with respect to a virtual driving environment 26 and determine the view or condition within the virtual driving environment 26 to be sensed at that moment by that particular virtual sensor 40.

For a first simulated moment in time, a simulation module 32 may determine the views or conditions of the virtual driving environment 26 to be sensed at that moment by one or more virtual sensors 40. A simulation module 32 may then obtain from one or more appropriate sensor models 24 outputs that characterize those views or conditions. This process may be repeated for a second simulated moment in time, a third simulated moment in time, and so forth. Accordingly, by advancing from one moment in time to the next, a simulation module 32 may obtain one or more data streams respectively modeling what would be the output of the one or more virtual sensors 40 had they and the corresponding virtual driving environment 26 been real.

Figure 4:
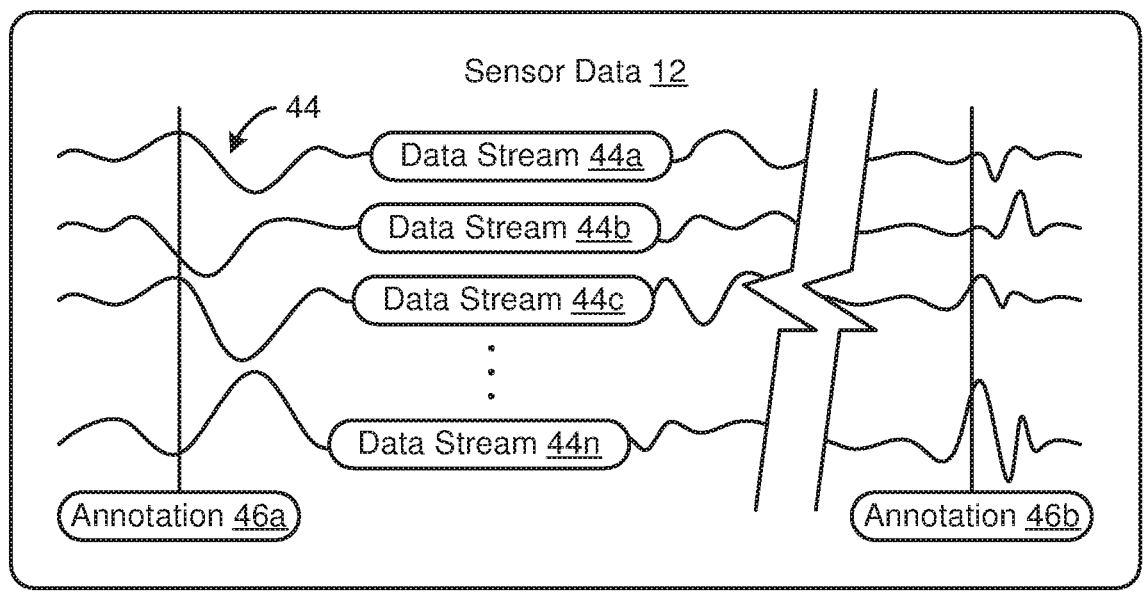
FIG. 4 is a schematic diagram illustrating one embodiment of sensor data tagged with one or more annotations in accordance with the present invention.
Figure 5:
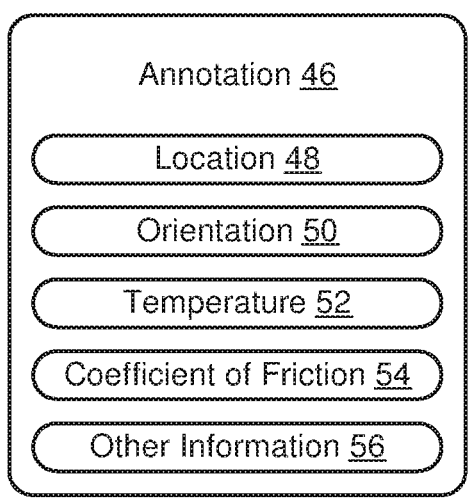
FIG. 5 is a schematic block diagram illustrating one embodiment of an annotation in accordance with the present invention.

Referring to FIGS. 4 and 5, in selected embodiments, different data streams 44 may represent the output of different virtual sensors 40. For example, a first data stream 44a may represent the output of a virtual camera mounted so as to be forward-looking on the front portion of a virtual vehicle 42, a second data stream 44b may represent the output of a virtual laser, lidar, or radar device mounted so as to be forward-looking on the front of the virtual vehicle 42, a third data stream 44c may represent the output of a virtual thermometer mounted on the virtual vehicle 42, and a forth data stream 44n may represent the output of a virtual vehicle-dynamics sensor mounted on the virtual vehicle 42. Collectively, the various data streams 44 forming the sensor data 12 for a particular run (e.g., a particular virtual traverse of a particular virtual vehicle 42 through a particular virtual driving environment 26) may represent or account for one or more (e.g., all or less than all) inputs that a particular algorithm (i.e., the algorithm that is being developed or tested) would use in the real world.

In certain embodiments or situations, a simulation module 32 may couple sensor data 12 with one or more annotations 46. Each such annotation 46 may provide "ground truth" corresponding to the virtual driving environment 26. In selected embodiments, the ground truth contained in one or more annotations 46 may be used to quantify an algorithm's performance in classifying railroad crossings 28a or other structures 28, classifying weather conditions, or the like in a supervised learning technique.

For example, one or more annotations 46 may provide true locations 48, true orientations 50, true ambient temperatures 52, true coefficients of friction 54 (e.g., between the tires of the virtual vehicle 42 and the virtual road surface 36 as dictated by a simulated weather condition), other information 56, or the like or combinations thereof corresponding to the virtual road surface 36 or various railroad crossings 28a, cattle guards 28b, or the like encountered by a virtual vehicle 42 in a particular run. Annotations 46 may be linked, tied to, or otherwise associated with particular portions of the data streams 44. Accordingly, the ground truth corresponding to a particular weather condition, structure 28, or the like may be linked to the portion of one or more data streams 44 that reflect the perception of one or more virtual sensors 40 of that weather condition, structure 28, or the like. In selected embodiments, this may be accomplished by linking different annotations 46a, 46b to different portions of one or more data streams 44.

Figure 6:
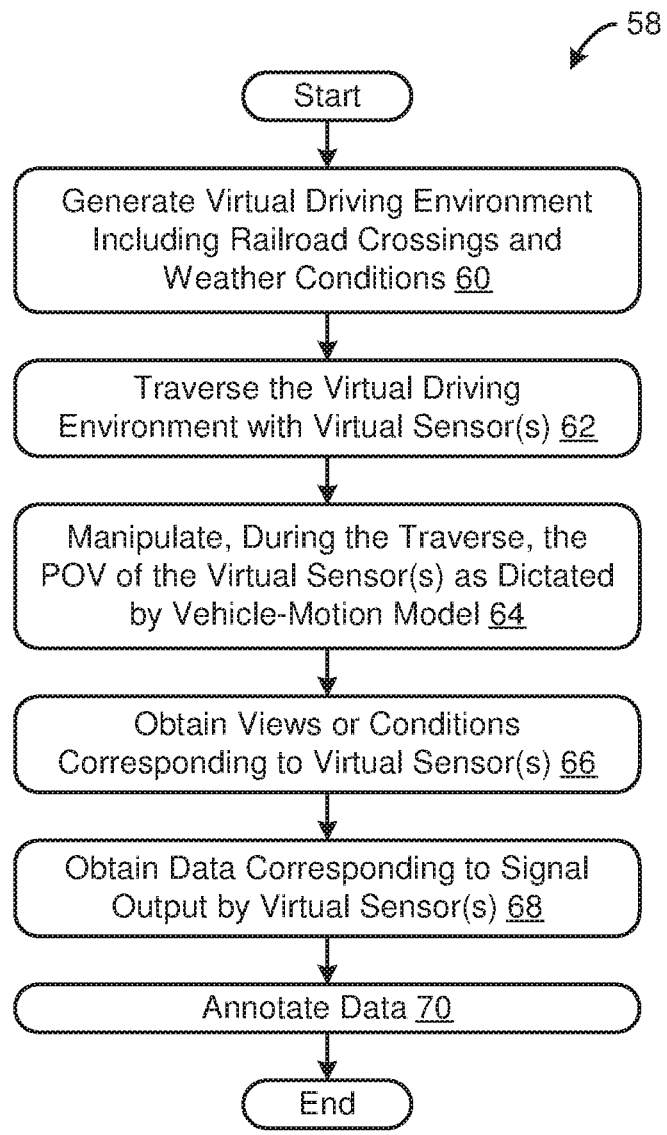
FIG. 6 is a schematic block diagram of one embodiment of a method for generating training data in accordance with the present invention.

Referring to FIG. 6, a system 10 may support, enable, or execute a process 58 in accordance with the present invention. In selected embodiments, such a process 58 may begin with generating 60 a virtual driving environment 26 including various weather conditions 30 and structures 28 such as railroad crossings 28a, cattle guards 28b, and/or the like. The virtual driving environment 26 may then be traversed 62 in a simulation process with one or more virtual sensors 40. The one or more virtual sensors 40 may represent one or more cameras, lidar devices, radar devices, ultrasound transducers, thermometers, vehicle-dynamics sensors, or the like or any combination or sub-combination thereof.

As the virtual driving environment 26 is traversed 62 with one or more virtual sensors 40, the point of view of the one or more virtual sensor 40 with respect to the virtual driving environment 26 may change with each incremental step. In selected embodiments, the point of view of one or more virtual sensor 40 with respect to the virtual driving environment 26 may be manipulated 64 as dictated by a vehicle-motion model 22. Accordingly, the various views or conditions to be sensed by the one or more virtual sensors 40 at various simulated moments in time may be obtained 66 or identified 66.

The various views or conditions thus obtained 66 or identified 66 may be analyzed by or via corresponding sensor models 24 in order to obtain 68 data 12 reflecting what a corresponding real world sensor viewing (i.e., sensing) the various views or conditions in the real world would have produced or output. In selected embodiments, this data 12 may be annotated 70 with ground truth information to support or enable certain supervised learning techniques.

Thus, one or more virtual sensors 40 may be positioned relative to a virtual roadway 36 according to their planned positioning on a real world vehicle. The virtual sensors 40 may then be moved along the virtual roadway 36 into locations where they can observe railroad crossings 28a, cattle guards 28b, or the like. The one or more virtual sensors 40 may then produce data 44 as they move through the virtual environment 26.

For each time step of produced data 44, annotations 46 may be automatically provided to record ground truth information about the boundaries of the intersection between the railroad tracks 28a and the street 36, boundaries of the intersection between the cattle guard 28b and the street 36, weather conditions, or the like or a combination or sub-combination thereof. For example, each frame of produced data 44 may have a complimentary entry in a log file that records the current status of relevant weather conditions and defines lines or splines that correspond to the locations of the railroad tracks 28a, cattle guard 28b, or the like relative to the produced data 44 and relative to the virtual vehicle 42.

Once generated, sensor data 12 in accordance with the present invention may be used to train or test various algorithms. In certain embodiments, the ground truth information forming part of the sensor data 12 may be used to train one or more algorithms (e.g., one or more perception algorithms) using supervised learning or to test an existing algorithm and quantify its performance.

For example, the sensor data 12 may be used to train or test one or more algorithms used by vehicular systems to lower the adverse effects associated with crossing railroad tracks, cattle guards, or the like in the real world in various (e.g., adverse) weather conditions. Accordingly, the sensor data 12 may be used to train (or test the ability of) one or more algorithms to perceive railroad tracks and cattle guards, distinguish between metal cattle guards and painted cattle guards, implement weather-appropriate responses or preparations when such structures are perceived, or the like or combinations or sub-combinations thereof.

The flowchart in FIG. 6 illustrates the architecture, functionality, and operation of a possible implementation of a system, method, and computer program product according to one embodiment of the present invention. In this regard, each block in the flowchart may represent a module, segment, or portion of code, which comprises one or more executable instructions for implementing the specified logical function(s). It will also be noted that each block of the flowchart illustration, and combinations of blocks in the flowchart illustration, may be implemented by special purpose hardware-based systems that perform the specified functions or acts, or combinations of special purpose hardware and computer instructions.

It should also be noted that, in some alternative implementations, the functions noted in the blocks may occur out of the order noted in the Figure. In certain embodiments, two blocks shown in succession may, in fact, be executed substantially concurrently, or the blocks may sometimes be executed in the reverse order, depending upon the functionality involved. Alternatively, certain steps or functions may be omitted if not needed.

In the above disclosure, reference has been made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," "selected embodiments," "certain embodiments," etc., indicate that the embodiment or embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, an in-dash vehicle computer, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

It should be noted that the sensor embodiments discussed above may comprise computer hardware, software, firmware, or any combination thereof to perform at least a portion of their functions. For example, a sensor may include computer code configured to be executed in one or more processors, and may include hardware logic/electrical circuitry controlled by the computer code. These example devices are provided herein purposes of illustration, and are not intended to be limiting. Embodiments of the present disclosure may be implemented in further types of devices, as would be known to persons skilled in the relevant art(s).

At least some embodiments of the disclosure have been directed to computer program products comprising such logic (e.g., in the form of software) stored on any computer useable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, but should be defined only in accordance with the following claims and their equivalents. The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

What is claimed is:

1. A method for generating data usable in developing, training, or proving algorithms for negotiating railroad crossings, the method comprising:
   traversing, by a computer system, one or more virtual sensors over a virtual road surface in a simulation;
   recording, by the computer system, data corresponding to signals output by the one or more virtual sensors during the traversing, wherein the data characterizes a virtual railroad crossing in the virtual road surface; and
   annotating, by the computer system, the data with ground-truth data corresponding to the virtual railroad crossing, wherein the ground-truth data includes a relative orientation of the virtual railroad crossing.

2. The method of claim 1, wherein the virtual railroad crossing is one of a plurality of virtual railroad crossings distributed cross the virtual road surface, each virtual railroad crossing of the plurality of virtual railroad crossings defining a structure sensible by the a first sensor of the one or more virtual sensors.

3. The method of claim 2, wherein the traversing comprises moving each of the one or more virtual sensors with respect to the virtual road surface as dictated by a vehicle-motion model modeling motion of a vehicle carrying the one or more virtual sensors and driving on the virtual road surface.

4. The method of claim 3, wherein the one or more virtual sensors comprise a forward-looking sensor positioned to sense a portion of the virtual road surface ahead of the vehicle.

5. The method of claim 4, wherein the forward-looking sensor is a camera, radar, or lidar device.

6. The method of claim 5, wherein the data further characterizes weather conditions proximate the virtual road surface.

7. The method of claim 6, wherein the annotating further comprises annotating the data with ground-truth information corresponding to the weather conditions proximate the virtual road surface.

8. The method of claim 7, wherein a second virtual sensor comprises a thermometer.

9. The method of claim 8, wherein the data characterizes an ambient temperature proximate the virtual road surface.

10. The method of claim 9, wherein the annotating further comprises annotating the data with ground-truth information comprising at least one temperature value proximate the virtual road surface.

11. A method of generating training data, the method comprising:
    executing, by a computer system, a simulation comprising
      traversing one or more virtual sensors over a virtual road surface, the virtual road surface defining one or more virtual railroad crossings that are each sensible by a first sensor of the one or more virtual sensors, and
      moving, during the traversing, each of the one or more virtual sensors with respect to the virtual road surface as dictated by a vehicle-motion model modeling motion of a vehicle driving on the virtual road surface while carrying the one or more virtual sensors;
    recording, by the computer system, perception data characterizing the one or more virtual railroad crossings, the data corresponding to signal output by the first virtual sensor during the traversing; and
    annotating, by the computer system, the perception data with ground-truth data corresponding to each of the one or more virtual railroad crossings, wherein the ground-truth data includes a relative orientation of each virtual railroad crossing of the one or more virtual railroad crossing.

12. The method of claim 11, wherein the relative orientation numerically characterizes an angle at which a corresponding virtual railroad crossing of the one or more virtual railroad crossings crosses the virtual road surface.

13. The method of claim 11, wherein the first virtual sensor comprises a forward-looking sensor positioned to sense a portion of the virtual road surface ahead of the vehicle.

14. The method of claim 13, wherein the forward-looking sensor is a camera, radar, or lidar device.

15. The method of claim 14, wherein the perception data further characterizes weather conditions proximate the virtual road surface.

16. The method of claim 15, wherein the annotating further comprises annotating the perception data with ground-truth data corresponding to the weather conditions proximate the virtual road surface.

17. The method of claim 16, wherein a second virtual sensor comprises a thermometer.

18. The method of claim 17, wherein the perception data characterizes an ambient temperature proximate the virtual road surface.

19. The method of claim 18, wherein the annotating further comprises annotating the perception data with ground-truth data comprising at least one temperature value proximate the virtual road surface.

20. A computer system comprising:
    one or more processors;
    memory operably connected to the one or more processors; and
    the memory storing
      a virtual driving environment programmed to include a plurality of virtual railroad crossings,
      a first software model programmed to model a forward-looking sensor, a second software model programmed to model a vehicle, a simulation module programmed to use the virtual driving environment, the first software model, and the second software model to produce an output modeling what would be output by the forward-looking sensor had the forward-looking sensor been mounted to the vehicle and the vehicle had driven on an actual driving environment matching the virtual driving environment, and the simulation module further programmed to annotate the output with ground-truth data corresponding to the plurality of virtual railroad crossings, wherein the ground-truth data includes a relative orientation of each virtual railroad crossing of the plurality of virtual railroad crossings.

* * * * *